(12) United States Patent
Jeon

(10) Patent No.: US 6,930,933 B2
(45) Date of Patent: Aug. 16, 2005

(54) SEMICONDUCTOR MEMORY DEVICE WHICH CAN RECOVER A MEMORY FAIL

(75) Inventor: Byung Deuk Jeon, Chungcheongbuk-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 27 days.

(21) Appl. No.: 10/241,172

(22) Filed: Sep. 11, 2002

(65) Prior Publication Data

US 2003/0072197 A1 Apr. 17, 2003

(30) Foreign Application Priority Data

Sep. 14, 2001 (KR) ......................................... 2001-56848

(51) Int. Cl.[7] ................................................. G11C 7/00
(52) U.S. Cl. .................. 365/200; 365/201; 365/230.01; 365/230.02; 365/230.03
(58) Field of Search ............................... 365/200, 201, 365/230.01, 230.02, 230.03

(56) References Cited

U.S. PATENT DOCUMENTS

| | | | | |
|---|---|---|---|---|
| 5,495,447 A | * | 2/1996 | Butler et al. ................. | 365/200 |
| 5,548,553 A | * | 8/1996 | Cooper et al. ............... | 365/200 |
| 6,021,512 A | * | 2/2000 | Lattimore et al. .......... | 714/710 |

* cited by examiner

Primary Examiner—Connie C. Yoha
(74) Attorney, Agent, or Firm—Ladas & Parry LLP

(57) ABSTRACT

Redundancy circuits for accessing the stored data in the memory banks are provided in a semiconductor memory. First and second memory banks, each has 2N number of redundancy lines. Only N number of redundancy lines in each memory bank is utilized during normal operations. During normal operations, a first redundancy control block provides N number of redundancy signals to the first memory bank. A second redundancy control block provides N number of redundancy signals to the second memory bank. An address signal switching unit receives memory bank failure signals. During normal operations, the address signal switching unit multiplexes the N number of redundancy signals from the redundancy control block to the N number of redundancy lines of the corresponding memory bank. Upon failure of a memory bank, the address signal switching unit multiplexes the N number of the redundancy signals corresponding to the failed memory bank to the other operational memory bank so that the operational memory bank utilize a total of 2N number of redundancy lines.

9 Claims, 5 Drawing Sheets

SEMICONDUCTOR MEMORY DEVICE WHICH CAN RECOVER A MEMORY FAIL

BACKGROUND OF THE INVENTION

1. Field of the Invention

The present invention relates generally to a redundancy efficiency increasing circuit of semiconductor memory device and, more particularly, to a redundancy efficiency increasing circuit of semiconductor memory device which can increase efficiency of redundancy twice by using unused fuse having a block fail when a block fail is generated, thereby only a half of chip is used.

2. Description of the Related Art

FIG. 1 shows generally the column redundancy structure in a conventional semiconductor memory device. In FIG. 1, only two memory banks, labeled as Bank i and Bank k, are used in describing the conventional column redundancy structure although more than two memory banks may be used. Each memory bank (either Bank i or Bank k) includes four memory blocks, one of which is shown with a reference label 10 in FIG. 1. Further, in each memory bank Bank i or Bank k, there are two column redundancy lines RYS0 and RYS1. Up to two column fails (occurring, for example, while accessing the data in the memory block) are recoverable in any one of the memory blocks 10 by allowing one of the two column redundancy lines RYS0 or RYS1 to substitute for the other column redundancy line. The same operations of column redundancy line substitutions in the event of a column fail is also performed in the other remaining memory blocks 10 in the same memory bank, Bank i or Bank k. According to this conventional column redundancy structure, only up to two column fails are recoverable in any one conventional memory bank, Bank i or Bank k.

Associated with each bank, Bank i or Bank k, a redundancy control block 30 having a Y fuse 20 is provided to control and oversee the column fail recovery operation in each memory bank Bank i or Bank k. The column fail recovery operations for the column line substitution operations are performed based at least on the signals for comparing the Y address, AY<0:m>, the signals for bank coding BAi, and the signals for X block coding Bxi<0:n> that are inputted to redundancy control block 30 as shown in FIG. 1. However, in the event of an unrecoverable block fail in a memory bank (e.g., Bank k) due to, for example, more than two unrecoverable column fails generated in a memory bank, the other bank, Bank i, could only be used. As already discussed above, recovering from more than two column fails in one memory bank 10 of a conventional column redundancy structure as shown FIG. 1 is not possible. Therefore, the Y fuse of a failed memory bank (for example, of the Bank k) cannot be used for any other operational memory bank(s) such as the Bank i in FIG. 1.

SUMMARY OF THE INVENTION

Therefore, the present invention has been made to solve the above-mentioned problems and a primary objective of the present invention is to provide a redundancy efficiency increasing circuit of semiconductor memory device which can increase efficiency of redundancy by using unused fuse in a redundancy of another bank when a block fail is generated in one bank and it is impossible to improve the fail.

In order to accomplish the above object, the present invention comprises 2 N banks having 2M redundancy lines-(2n−1)th bank and (2n)th bank have a corresponding relation, and n is a natural number in the range of 1 to N—and a fuse circuit, including: 2N redundancy control blocks for enabling redundancy lines of corresponding bank in the banks according to received address signal; and an address signal switch unit for receiving a first control signal, a second control signal and an address signal to provide a bank address signal selecting (2n−1)th bank to corresponding redundancy control block of (2n−1)th bank and (2n)th bank when only the first control signal is enabled, provide a bank address signal selecting (2n)th bank to corresponding redundancy control block of (2n−1)th bank and (2n)th bank when only the second control signal is enabled and provide a bank address signal selecting (2n−1)th bank to corresponding redundancy control block of (2n−1)th bank an a bank address signal selecting (2n)th bank to corresponding redundancy control block of (2n)th bank when both the first control signal and the second control signal are enabled.

In the 2M redundancy lines, M redundancy lines are operated to improve fails of the bank and another M redundancy lines are operated to improve fails of the corresponding bank. The first control signal and the second control signal are generated by bonding option. The redundancy line is a column redundancy line.

The redundancy efficiency increasing circuit of semiconductor memory device according to the present invention can increase redundancy efficiency twice by using a first to a third multiplexers to use the fuse of bank having the block fail when a block fail is generated and it is impossible to improve.

DETAILED DESCRIPTION OF THE INVENTION

The above objects, and other features and advantages of the present invention will become more apparent after reading the following detailed description when taken in conjunction with the drawings.

As already discussed in the Background section of this disclosure, in case of a memory block fail in a conventional memory bank (which may be caused by more than two column fails), the Y fuse of the of the failed memory bank cannot be used for the any other operational memory bank for column fail recovery purposes. The present invention solves this and other problems associated with the conventional memory devices. In particular, the present invention (which will be described hereinbelow in more detail) allows the Y fuse of a failed memory bank caused by an unrecoverable block fail condition to be available for use by the other operational memory bank(s).

Figure 1:
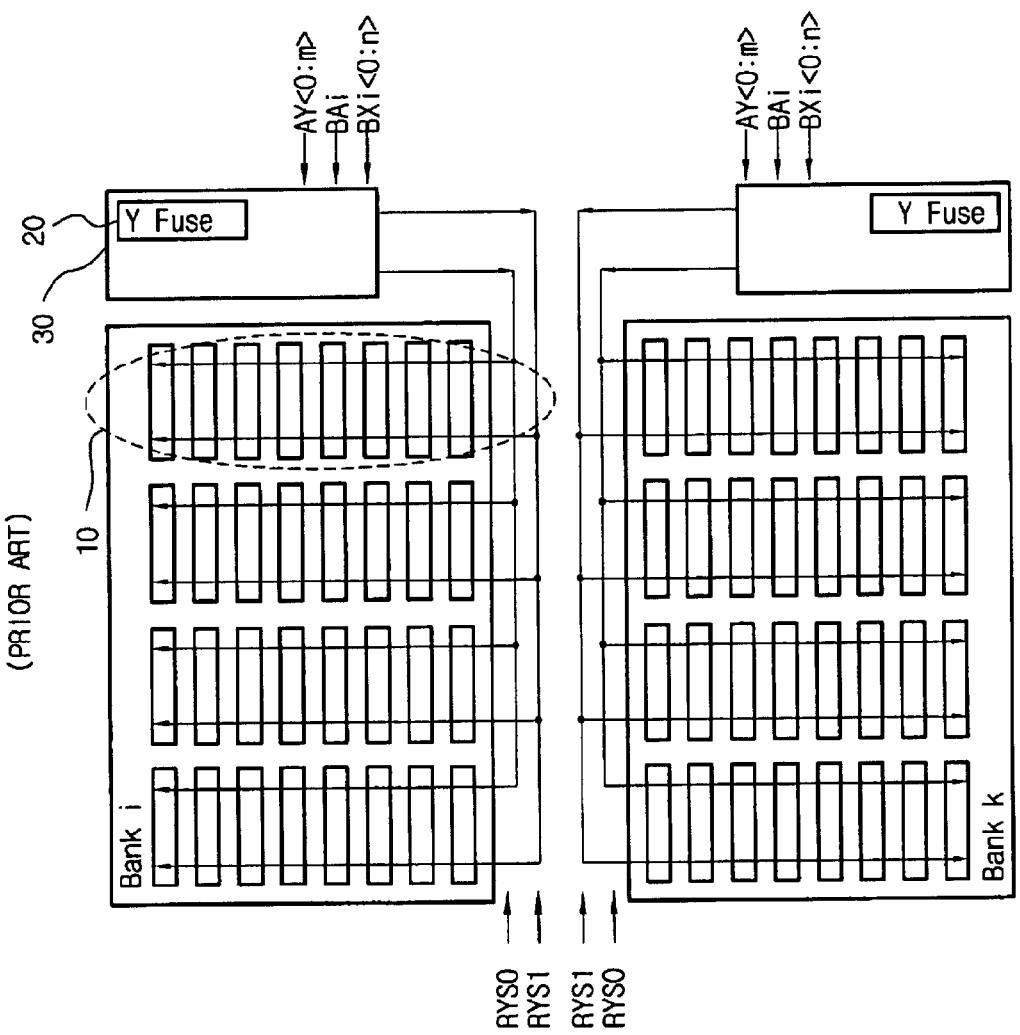
FIG. 1 is a drawing showing the arrangement of a column redundancy circuit structure according to a conventional semiconductor memory device.
Figure 2:
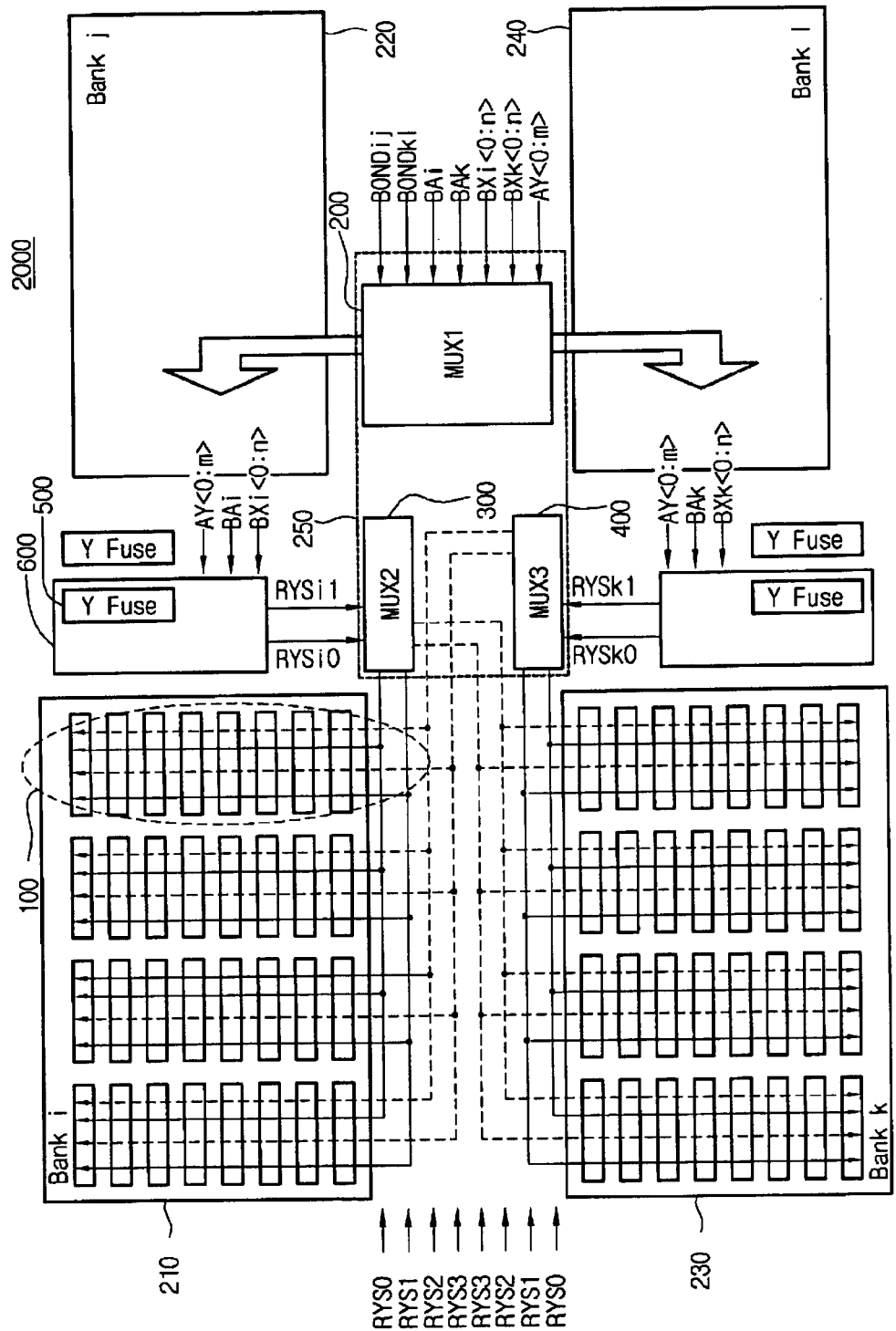
FIG. 2 is a block diagram of a redundancy efficiency increasing circuit of semiconductor memory device according to an embodiment of the present invention.

FIG. 2 is a block diagram of a semiconductor memory device generally showing the structure according to an embodiment of the present invention. Referring to FIG. 2, the semiconductor memory device 2000 according to an embodiment of the present invention comprises four memory banks: Bank i 210, Bank j 210, Bank k 230, Bank l 240. An address signal switch unit 250 is provided to this set of four memory banks 210, 220, 230, 240.

The address signal switch unit 250 comprises a first multiplexer 200, a second multiplexer 300, and a third multiplexer 400. Although four memory banks 210, 220, 230, 240 are shown in FIG. 2, an embodiment of the present invention is described with respect to Bank i 210 and Bank k 230. However, it should be readily apparent to those skilled in the art that similar operations and effects are equally applicable to the other pair of memory banks Bank j 220 and Bank l 240.

As shown in FIG. 2, there are four memory blocks (although only one is labeled as 100 in FIG. 2) in each memory bank 210, 220, 230, or 240. And, there are four column redundancy lines RYS0, RYS1, RYS2, RYS3 for each memory block 100. The two column redundancy lines RYS0, RYS1 are column redundancy lines generally for use during the normal operation of each memory bank, and the other two column redundancy lines RYS2, RYS3 are for use in the event when an unrecoverably failed memory bank is present in either pair of memory banks (for example, Bank i 210 and Bank j 220 grouped as one pair, and Bank j 230 and Bank l 240 grouped as another pair). The column redundancy lines RYS2, RYS3 are designed to allow the two column redundancy lines of the failed memory bank to be utilized in the other operational memory banks. Generally, the memory banks are paired for operational purposes, and the pairing is generally determined by the input/output structure(s) of the memory banks. As already explained, Banks i and j 210, 220 are paired and Banks k and l 230, 240 are paired for, for example, their input/output operations in an embodiment of the present invention; however, it should readily apparent to those skilled in the art that other combinations may be used to pair up the memory banks.

These column redundancy lines RYS0, RYS1, RYS2, RYS3 are arranged to the blocks in each memory bank by first, second, and third multiplexers 200, 300, 400 in the address switching unit 250. Further, a Y Fuse 500 is provided for each memory bank 210, 220, 230, 240 for column fail recovery operations. For example, in Bank i 210 in FIG. 2, the column redundancy signals RYS0, RYS1 are generated based on an AY<0:m> signal, which is for comparing the Y address(es), a BAi signal for providing the bank coding, and a Bxi<0:n> signal for providing the X block coding that are inputted to the redundancy control block 600 having the Y fuse 500.

The first multiplexer 200 can be understood for providing the switching operations for the bank coding based on the following inputted signals: the bank coding signals BAi, BAk; the X block coding signals BXi<0:n> and BXk<0:n>; and the signals BONDij and BONDkl that are inputted to the multiplexer 200 through an bonding option. Based on these inputted signals for example, the first multiplexer 200 outputs the BAi and BXi<0:n> signals to the redundancy control block 600 for the Bank i 210 and outputs the BAk and BXk<0:n> signals to the redundancy control block 600 for the Bank k 230.

The BONDij and BONDkl signals are applied in the event that a bank failure condition is detected during the test after manufacturing the device. For example, in the event that a fail condition is detected in either Bank i 210 or Bank j 220, the BONDij signal is held to a low level and the BONDkl signal is held to a high level through a bonding option. More specifically with respect to the bonding option, the high or low level for each BONDij and BONDkl signal is determined by connecting (or not connecting) the selected one of the bonding pads (that are also connected to the circuits for generating the BONDij or BONDkl signals) to a voltage Vss.

In the similar manner, the BONDij signal is held to a high level and BONDkl signal is held to a low level through the bonding option, in the event a fail condition is detected in either Bank k 230 or Bank l 240.

The second multiplexer 300 receives the BOND ij signal and the RYSi0 or RYSi1 signals from the redundancy control block 600 for Bank i 210. Likewise, the third multiplexer 400 receives the BOND kl signal and the RYSk0 or RYSk1 signals from the redundancy control block 600 for Bank k 230.

With respect to the column redundancy lines RYS0, RYS1, RYS2, RYS3 for Bank i 210, and in the event that the BOND ij signal is at high and BOND kl is low, the second multiplexer 300 would provide the RYSi0 and RYSi1 signals to the RYS0 and RYS1 column redundancy lines, and the third multiplexer 400 would provide the RYSk0 and RYSk1 signals to the RYS2 and RYS3 column redundancy lines.

With respect to the column redundancy lines RYS0, RYS1, RYS2, RYS3 for Bank k 230, and in the event that BOND kl signal is held to a high level, the third multiplexer 400 would provide the RYSk0 and RYSk1 signals to the RYS0 and RYS1 column redundancy lines for the Bank k 230, and the second multiplexer 300 would provide its RYSi0 and RYSi1 signals to the RYS2 and RYS3 column redundancy lines.

Each bank is connected to a Y Fuse 500 as shown in FIG. 2, and the redundancy control block 600 that includes the Y Fuse 500 is utilized for recovering from the column fails in the associated column bank. For example in relation to Bank i 210, the AY<0:m> signal for comparing the Y address(es), the BAi signal for the bank coding, and the BXi<0:n> signal for the X block coding are inputted to the redundancy control block 600 that has the Y fuse 500, and the redundancy control block 600 thereby generates the column redundancy select signals RYSi0, RYSi1 based on these inputted signals.

Figure 3:
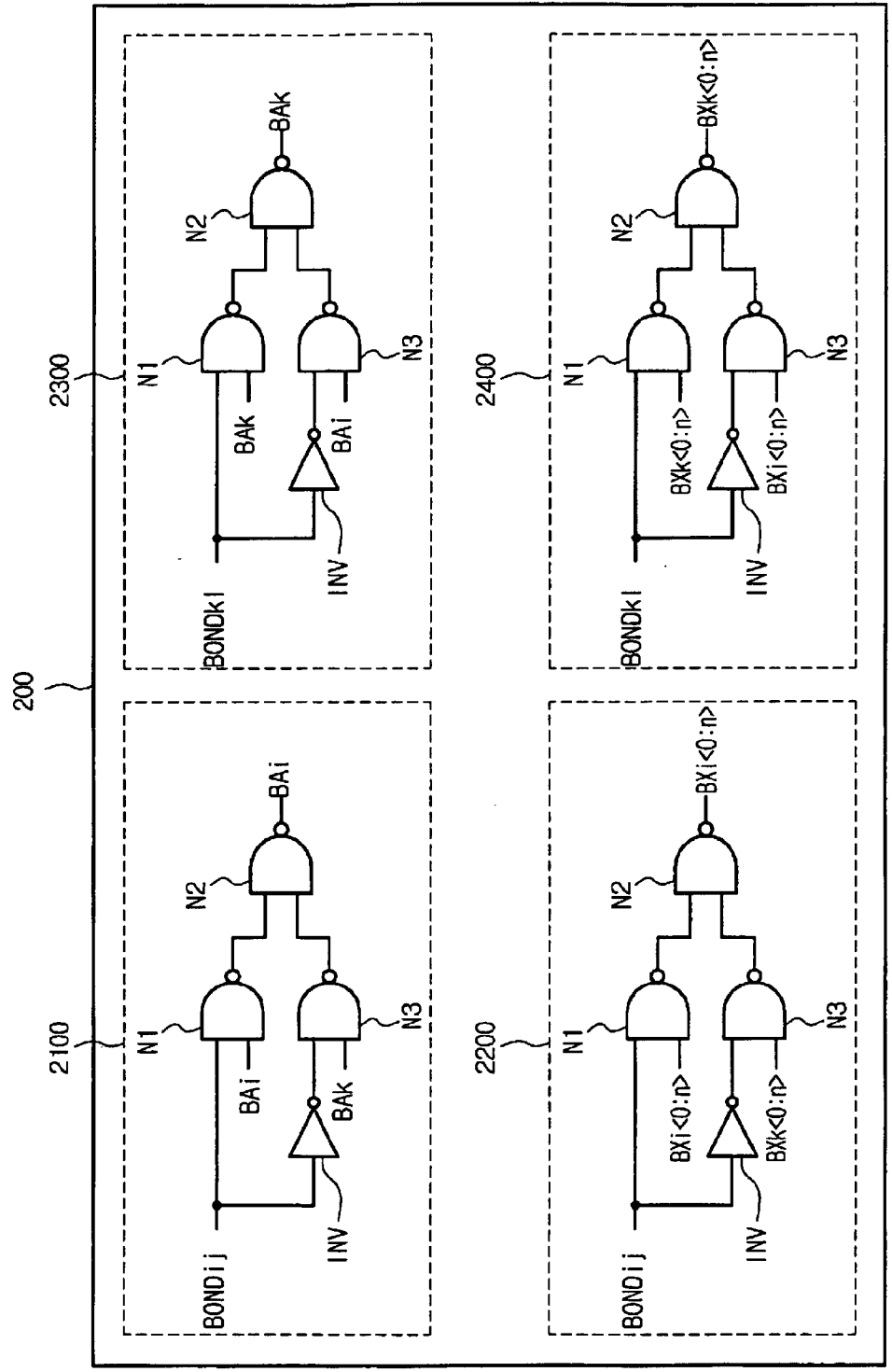
FIG. 3 is a circuit diagram of a first multiplexer shown in FIG. 2.

FIG. 3 is a circuit diagram to further explain the operations of the first multiplexer 200 in FIG. 2. As shown in the drawing, the first multiplexer 200 comprises four groups 2100, 2200, 2300, 2400 of the identical circuit. Each circuit of the groups 2100, 2200, 2300, 2400 has an inverter INV, a first NAND gate N1, a second NAND gate N2, and a third NAND gate N3. 200.

In each group 2100, 2200, 2300, or 2400, a first multiplexer input signal and a second multiplexer input signal is inputted to the first NAND gate N1, and a third multiplexer input signal is inputted to the third NAND gate N3 as shown in FIG. 3.

The inverter INV in each of the four groups inverts the first multiplexer input signal. The inverted signal outputted from the inverter INV is then inputted into the third NAND gate N3 together with the third multiplexer input signal. The outputs of the first and third NAND gates, N1, N3 are inputted to the second NAND gate N2. The output of the second NAND gate N2 (also referred to as the fourth multiplexer output signal) is then inputted to the redundancy control block 600 having the Y Fuse 500 as shown in FIG. 2.

In the first group 2100, the first multiplexer input signal is the BONDij signal, the second multiplexer input signal is the BAi signal, the third multiplexer input signal is the BAk signal, and the fourth multiplexer output signal is the BAi signal that is inputted to the redundancy control block 600.

In the second group 2200, the first multiplexer input signal is the BONDij signal, the second multiplexer input signal is the BXi<0:n> signal, the third multiplexer input signal is the BXk<0:n> signal, and the fourth multiplexer output signal is the BXi<0:n> signal that is inputted to the redundancy control block 600.

In the third group 2300, the first multiplexer input signal is the BONDkl signal, the second multiplexer input signal the BAk signal, the third multiplexer input signal is the BAi signal, and the fourth multiplexer input signal is the BAk signal that is inputted to the redundancy control block 600.

In the fourth group 2400, the first multiplexer input signal is the BONDkl signal, the second multiplexer input signal is the BXk<0:n> signal, the third multiplexer input signal is the BXi<0:n> signal, and the fourth multiplexer input signal is the BXk<0:n> signal that is inputted to the redundancy control block 600.

The operations for these four groups 2100, 2200, 2300, 2400 of the multiplexer 200 as shown in FIG. 3 are described as follows.

In the case when an unrecoverable failure condition is present in the Bank k 230 or Bank l 240, the BONDij signal would be in a high level and the BONDkl signal would be in a low level. In this case for the first group 2100, the second multiplexer input signal of BAi would be inputted to the second NAND gate N2 and also outputted as the fourth output signal BAi in the first group 2100, independent of the third multiplexer input signal BAk. In the case of the third group 2300, the fourth output signal of the second NAND gate N2 would be BAi regardless of the the second multiplexer input signal BAk, which is inputted to the first NAND gate N1 in the group 2300. Therefore, the coding information of the Bank i is inputted to the redundancy control block 600 of the Bank k, thereby it is possible to be controlled by the Bank i.

In the same manner for the second group 2200, the fourth multiplexer output would be the BXi<0:n> signal (which is the block coding of the X (row) type). The fourth group 2400 would also output the BXi<0:n> signal as the fourth multiplexer output, regardless of the state of the BXk<0:n> signal. Therefore, the coding of Bank i is inputted to the redundancy control block 600 for the Bank k.

Figure 4:
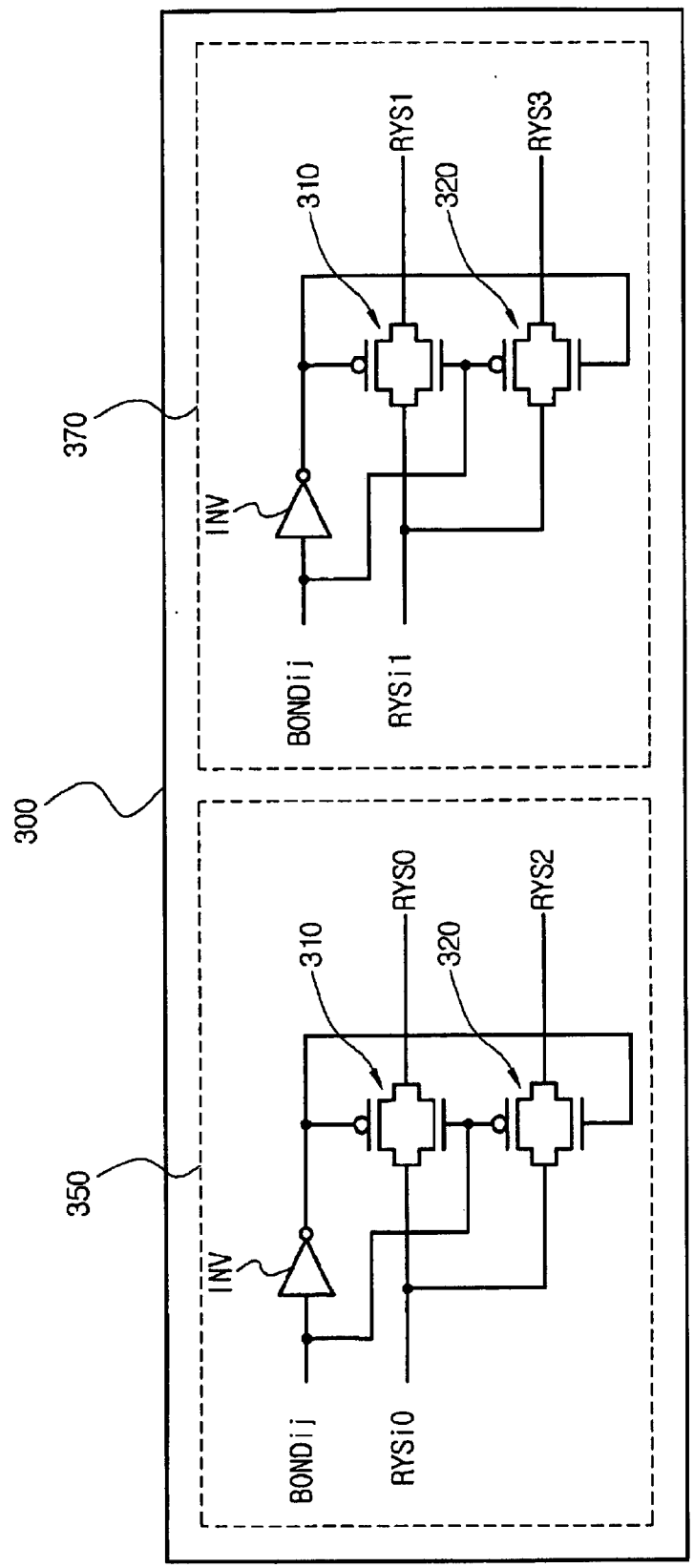
FIG. 4 is a circuit diagram of a second multiplexer shown in FIG. 2.
Figure 5:
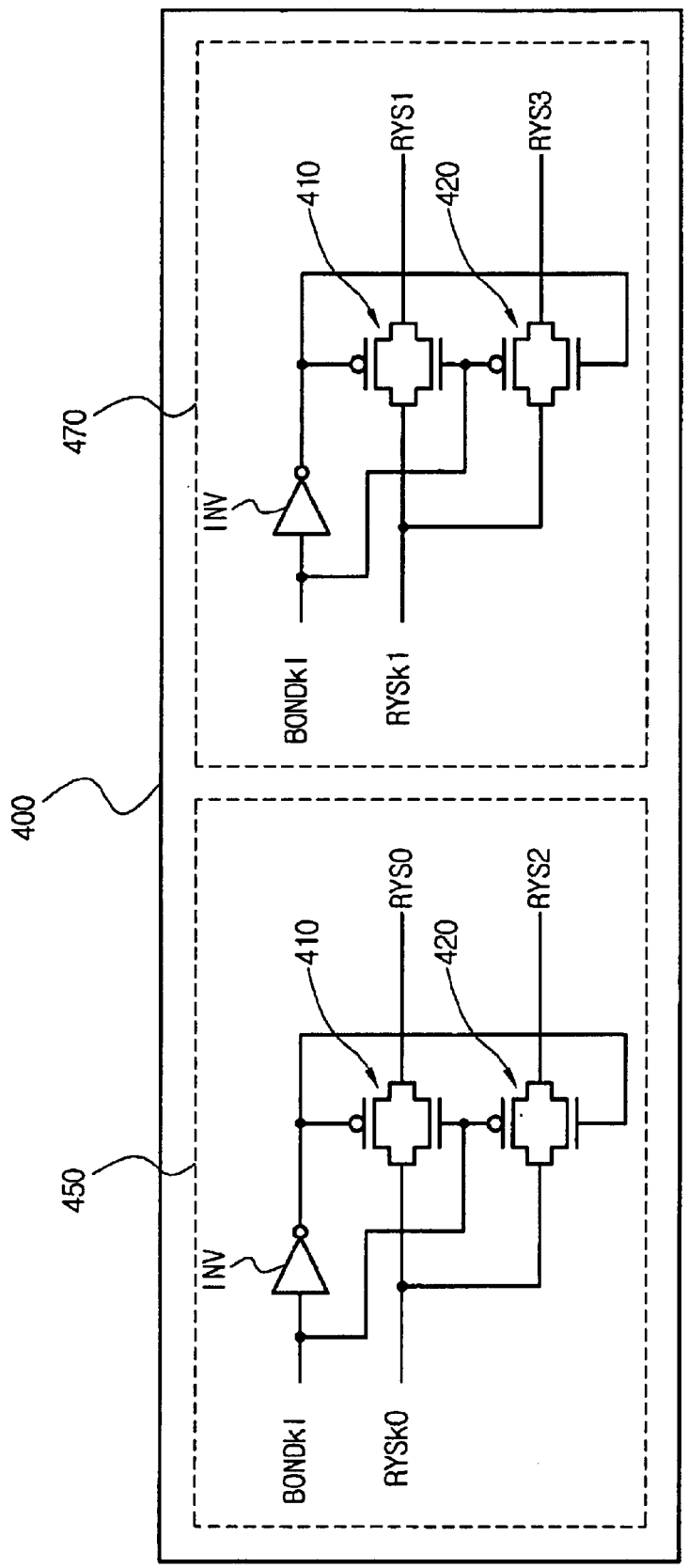
FIG. 5 is a circuit diagram of a third multiplexer shown in FIG. 2.

FIGS. 4 and 5 are circuit diagrams of the second multiplexer 300 and the third multiplexer 400. Each of the second and third multiplexers 300, 400 comprises one inverter INV and a first and a second transmission gates 310, 320. FIG. 4 shows two groups 350, 370 for the second multiplexer 300 where each group has identical circuit structure, but different inputs. Likewise, FIG. 5 shows two groups 450, 470 where each group has identical circuit structure for the third multiplexer 400.

Now referring to FIG. 4, the group 350 receives the BONDij signal and the column redundancy select signal RYSi0. The signal RYSi0 is an output signal of the redundancy control block 600 having the Y fuse 500 as shown in FIG. 2. Referring back to FIG. 4, the circuit in the group 350 includes an inverter INV, which receives and inverts the BONDij signal; a first transmission gate 310 receives the BONDij signal and the inverted signal outputted from the inverter INV. The transmission gate 310 transmits the RYSi0 signal to the column redundancy line RYS0 of the Bank i. A second transmission gate 320 receives the BONDij signal and the inverted signal from the inverter INV and transmits the RYSi0 signal to the column redundancy line RYS2 of the Bank k.

The group 370 of FIG. 4 receives the BONDij signal and the column redundancy select signal RYSi1. The signal RYSi1 is an output signal of the redundancy control block 600 having the Y fuse 500 as shown in FIG. 2, Referring back to FIG. 4, the circuit in the group 370 (which is of course identical to the circuit in the group 350) includes an inverter INV for inverting the BONDij signal. A first transmission gate 310 receives the BONDij signal and the inverted signal outputted from the inverter INV. The transmission gate 310 transmits the RYSi1 signal to the column redundancy line RYS1 of the Bank k. A second transmission gate 320 receives the BONDij signal and the inverted signal from the inverter INV and transmits the RYSi1 signal to the column redundancy line RYS3 of the Bank k.

Referring to FIG. 5, shown therein is the third multiplexer 400, which is illustrated with two groups 450, 470 of the same circuit structure to illustrate the operation based on different combination of input signals. The group 450 of the third multiplexer 400 receives the BONDkl signal and the column redundancy select signal RYSk0. The RYSk0 signal is the output signal of the redundancy control block 600 having the Y fuse 500 as shown in FIG. 2. Referring back to FIG. 5, the circuit in the group 450 includes an inverter INV for inverting the BONDkl signal; a first transmission gate 410 for receiving the BONDkl signal and the inverted signal outputted from the inverter INV. The transmission gate 410 transmits the RYSk0 signal to the column redundancy line RYS0 of the Bank k. A second transmission gate 420 receives the BONDkl signal and the inverted signal from the inverter INV and transmits the RYSk1 signal to the column redundancy line RYS3 of the Bank i.

When all banks are normally operating, the BONDij and BONDkl signals are enabled to a 'high' level. Therefore, the RYSi0 signal, which is the column redundancy select signal in the second multiplexer 300, is loaded on the column redundancy line RYS0 of the Bank i. Likewise, the RYSi1 signal is also loaded on the column redundancy line RYS1 of the Bank i. Similarly, the RYSk0 signal, which is the column redundancy select signal in the third multiplexer 400, is loaded on the column redundancy line RYS0 of the Bank k, and the RYSk1 signal is loaded on the column redundancy line RYS1 of the Bank k.

When a plurality of fails are generated in the Bank i or Bank j and when the BONDij signal becomes a 'low' level, the RYSi0 signal is loaded on the column redundancy line RYS2 of the Bank k in the second multiplexer 300, and the RYSi1 signal is loaded on the column redundancy line RYS3 of the Bank k. As a result, two column redundancy lines are added to the Bank k.

And, when a plurality of fails are generated in the Bank k or Bank l and when the BONDkl signal becomes a 'low' level, the RYSk0 signal is then loaded on the column redundancy line RYS2 of the Bank i in the third multiplexer 400, and the RYSk1 signal is loaded on the column redundancy line RYS3 of the Bank I. As a result, two column redundancy lines are added to the Bank i.

That is, the number of total column redundancy lines in the present invention is, for example, more than just two as in the case of a conventional system, but four: RYS0, RYS1, RYS2, RYS3 according to an embodiment of the present invention. This makes it possible to improve the column fail recovery operations as up to four column fails in a block 100

(as shown in FIG. 2) are recoverable. As a result, the present invention allows improved production yield of wafers since the present invention allows the devices to tolerate and recover 3 or 4 column fails that were conventionally considered as unrecoverable.

According to an embodiment of the present invention, one pair of banks can use four redundancy lines, while using two redundancy lines in a normal operation. However, it is also possible to use 2n number of redundancy lines, in which n redundancy lines are utilized in each bank in a normal operation.

And, the present invention can also be applied to row redundancy lines in a similar manner to improve the production yield of wafers which may have the number of row fails that were considered as unrecoverable according to the conventional techniques.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device having memory banks and redundancy circuits for accessing the stored data in the memory banks by row and column operations, the semiconductor memory device comprising:

a pair of first and second memory banks, each bank of the pair having a total of 2N number of redundancy lines for accessing the stored data, the N being a positive integer, wherein, only a first set of N number of redundancy lines are utilized to access the stored data during normal operations;

a pair of first and second redundancy control blocks, each redundancy control block is electrically connected to both the first and second memory banks, wherein the first redundancy control block provides N number of redundancy signals to the first memory bank for normal operation and the second redundancy control block provides N number of redundancy signals to the second memory bank for normal operation; and an address signal switching unit for receiving a set of input signals indicative of the first or second memory bank failure;

wherein, during operations without a memory bank failure, the address signal switching unit multiplexes the N number of redundancy signals from each of the first and second redundancy control blocks to the first set of the N number of redundancy lines of the corresponding one of the first and second memory banks; and wherein, upon determination of a memory bank failure, the address signal switching unit multiplexes the N number of the redundancy signals of the redundancy control block corresponding to the failed memory bank to the second set of the N number of the redundancy lines of the other operational memory bank of the pair so as to allow the operational memory bank to utilize a total of 2N number of redundancy lines.

2. The semiconductor memory device of claim 1, wherein the address signal switching unit comprises:

a first multiplexer for receiving the set of input signals indicative of failure of at least one of the paired first and second memory banks, the input signals including first and second bank coding signals, first and second block coding signals, and first and second bonding option signals, each bonding option signal being set to a high level when one failed bank is present in one pair of memory banks; and a second multiplexer for receiving the N number of redundancy signals from the first redundancy control block corresponding to the first memory bank and outputting the N number of redundancy signals to the first set of N number of redundancy lines in the first memory bank;

a third multiplexer for receiving the N number of redundancy signals from the second redundancy control block corresponding to the second memory bank and outputting the N number of redundancy signals to the first set of N number of redundancy lines in the second memory bank of the pair;

wherein, upon determination of failure of the second memory bank, the third multiplexer routes the N number of redundancy lines to the second set of N number of redundancy lines of the first memory bank; and wherein, upon determination of failure of the third memory bank, the second multiplexer routes the N number of redundancy lines to the second set of N number of redundancy lines of the second memory bank.

3. The semiconductor memory device of claim 2, wherein the bonding option signal is set to a high level by connecting a bonding pad, which is electrically connected to a circuit for indicating the high or low level of the bonding option signal, to a voltage source having a predetermined level of voltage.

4. The semiconductor memory device of claim 3, wherein the first multiplexer is comprised of:

a first group of circuit;
   a second group of circuit;
   a third group of circuit; and
   a fourth group of circuit;
      wherein each of the first, second, third, and fourth circuits have the identical circuit of:
         a first nand gate for receiving the first and second input signals;
         an inverter for inverting the first signal;
         a second nand gate for receiving the third input signal and the inverted first signal; and
         a third nand gate for receiving the output signals from the first and second nand gates and providing a fourth output signal.

5. The semiconductor memory device of claim 4, wherein the redundancy line is a column redundancy line.

6. The semiconductor memory device of claim 5, wherein, for the first group of circuit:

the first input signal is the first bonding signal;
   the second input signal is the first bank coding signal; and
   the third input signal is the second bank coding signal;
      wherein, when the first bonding signal is held to a high level and when the second bonding signal is held to a low level, the second input signal is outputted as the fourth output signal regardless of the third input signal.

7. The semiconductor memory device of claim 5, wherein, for the second group of circuit:

the first input signal is the first bonding signal;
   the second input signal is the first block coding signal; and
   the third input signal is the second block coding signal;
      wherein, when the first bonding signal is held to a high level and when the second bonding signal is held to a low level, the second input signal is outputted as the fourth output signal regardless of the third input signal.

8. The semiconductor memory device of claim 5, wherein, for the third group of circuit:

the first input signal is the second bonding signal;

the second input signal is the second bank coding signal; and the third input signal is the first bank coding signal;
wherein, when the first bonding signal is held to a high level and when the second bonding signal is held to a low level, the third input signal is outputted as the fourth output signal regardless of the second input signal.

9. The semiconductor memory device of claim 5, wherein, for the fourth group of circuit:

the first input signal is the second bonding signal;

the second input signal is the second block coding signal; and the third input signal is the first block coding signal;
wherein, when the first bonding signal is held to a high level and when the second bonding signal is held to a low level, the third input signal is outputted as the fourth output signal regardless of the second input signal.

* * * * *